(12) United States Patent
Djordjevic et al.

(10) Patent No.: US 8,176,381 B2
(45) Date of Patent: May 8, 2012

(54) MULTIDIMENSIONAL TURBO PRODUCT CODES AND GENERALIZED LOW-DENSITY PARITY-CHECK CODES WITH COMPONENT REED-SOLOMON CODES FOR OPTICAL TRANSMISSION

(75) Inventors: Ivan B. Djordjevic, Tucson, AZ (US); Lei Xu, Princeton, NJ (US); Ting Wang, West Windsor, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 706 days.

(21) Appl. No.: 12/392,374

(22) Filed: Feb. 25, 2009

(65) Prior Publication Data

US 2009/0282314 A1    Nov. 12, 2009

Related U.S. Application Data

(60) Provisional application No. 61/051,542, filed on May 8, 2008.

(51) Int. Cl.
*H03M 13/00* (2006.01)
(52) U.S. Cl. ........................................ 714/755
(58) Field of Classification Search .................. 714/755, 714/757, 761–764, 774, 781–788, 791, 793, 714/798, 799, 821
See application file for complete search history.

(56) References Cited

U.S. PATENT DOCUMENTS

| | | | |
|---|---|---|---|
| 7,188,301 B1 * | 3/2007 | Cameron et al. | 714/794 |
| 7,246,294 B2 * | 7/2007 | Kauschke et al. | 714/755 |
| 7,376,882 B2 * | 5/2008 | Friddell | 714/755 |
| 7,523,382 B2 * | 4/2009 | Kim et al. | 714/776 |
| 2005/0160347 A1 * | 7/2005 | Kim et al. | 714/776 |
| 2007/0127593 A1 * | 6/2007 | Lee et al. | 375/299 |

OTHER PUBLICATIONS

Djordjevic, I., et al. Low-Density Parity-Check Codes for 40-GB/S Optical Transmission Systems. 2006 IEEE. IEEE Journal of Selected Topics in Quantum Electronics. vol. 12, No. 4. Jul./Aug. 2006. pp. 555-562.

Elias, P. Error-Free Coding. Transactions of the IRE Professional Group on Information Theory. Sep. 1954. vol. 4, Issue 4. pp. 29-37.

Mizuochi, T., et al. Forward Error Correction Based on Block Turbo Code With 3-Bit Soft Decision for 10GB/S Optical Communication Systems. 2004 IEEE. IEEE Journal of Selected Topics in Quantum Electronics. vol. 10, No. 2. Mar./Apr. 2004. pp. 376-386.

* cited by examiner

*Primary Examiner* — Nadeem Iqbal
(74) *Attorney, Agent, or Firm* — Joseph Kolodka; James Bitetto

(57) ABSTRACT

A transmitter, a receiver, and corresponding methods are provided. The transmitter includes encoders configured to encode source bit streams from L information sources into bytes of codewords. Each encoder includes different (n, k) multidimensional turbo-product codes of code rate R=k/n, where k is a number of information bytes, and n is code word length. The encoders operate in at least two phases. A first phase involves operating $k_y$ column-encoders in parallel on $k_x$ bytes per column to generate the code words for a current dimension. A second phase involves operating $n_x$ row-encoders in parallel on $k_y$ memory locations per rows to generate the code words for the current dimension. The first and second phases are repeated for remaining layers of the current dimension and layers of other dimensions.

26 Claims, 5 Drawing Sheets

MULTIDIMENSIONAL TURBO PRODUCT CODES AND GENERALIZED LOW-DENSITY PARITY-CHECK CODES WITH COMPONENT REED-SOLOMON CODES FOR OPTICAL TRANSMISSION

RELATED APPLICATION INFORMATION

This application claims priority to provisional application Ser. No. 61/051,542 filed on May 8, 2008, incorporated herein by reference.

BACKGROUND

1. Technical Field

The present invention relates to optical communications, and more particularly to multidimensional turbo product codes and generalized low-density parity-check codes with component Reed-Solomon codes for optical transmission.

2. Description of the Related Art

Network providers already consider 100 Gb/s per dense wavelength-division multiplexing (DWDM) channel transmission for future optical networks. The bit-error ratio (BER) performance of such systems is degraded significantly due to intra-channel fiber nonlinearities, polarization mode dispersion (PMD), and chromatic dispersion. In order to overcome those challenges, novel advanced techniques and devices in modulation, detection, coding and signal processing are required. The development of a novel powerful forward error correction (FEC) scheme suitable for beyond 100 Gb/s transmission and 100 Gb/s Ethernet is of high importance. To keep the BER quality for those systems comparable to that of a standard RS(255, 239) FEC scheme operating at 40 Gb/s, an FEC scheme providing at least 4 dB improvement in coding gain is necessary.

The soft iteratively decodable codes such as, for example, turbo-product codes (TPCs) and LDPC codes, are excellent candidates for use in high-speed optical communications. Although those schemes provide excellent performance improvement, they require soft bit reliabilities, and as such are still not implementable at data rates above 100 Gb/s.

SUMMARY

These and other drawbacks and disadvantages of the prior art are addressed by the present principles, which are directed to multidimensional turbo product codes and generalized low-density parity-check codes with component Reed-Solomon codes for optical transmission.

According to an aspect of the present principles, there is provided a transmitter. The transmitter includes a plurality of encoders configured to encode source bit streams from L information sources into bytes of code words. Each of the plurality of encoders includes different (n, k) multidimensional turbo-product codes (MTPCs) of code rate R=k/n, where k is a number of information bytes, and n is codeword length. The plurality of encoders are configured to operate in at least two phases. A first phase at least involves operating $k_y$ column-encoders from among the plurality of encoders in parallel on $k_x$ bytes per column to generate the code words for a current dimension. A second phase at least involves operating $n_x$ row-encoders from among the plurality of encoders in parallel on $k_y$ memory locations per rows to generate the code words for the current dimension. The first and the second phases are repeated for remaining layers of the current dimension and for layers of other dimensions.

According to another aspect of the present principles, there is provided a receiver. The receiver includes a demapper configured to receive samples of an input signal and determine candidate symbols for an input sequence included in the input signal. The receiver further includes one or more decoders configured to iteratively decode the input sequence based on the candidate symbols to obtain decoded codewords. Each of the one or more decoders is implemented based on multidimensional turbo-product codes (MTPCs). The plurality of decoders are configured to operate in at least two phases. A first phase at least involves operating $k_y$ column-decoders from among the plurality of decoders in parallel on $k_x$ bytes per column to generate the codewords for a current dimension. A second phase at least involves operating $n_x$ row-decoders from among the plurality of decoders in parallel on $k_y$ memory locations per rows to generate the code words for the current dimension. The first and the second phases are repeated for remaining layers of the current dimension and for layers of other dimensions.

According to yet another aspect of the present principles, there is provided a method. The method includes encoding source bit streams from L information sources into bytes of code words using a plurality of encoders. Each of the plurality of encoders includes different (n, k) multidimensional turbo-product codes (MTPCs) of code rate R=k/n, where k is a number of information bytes, and n is code word length. The method further includes modulating at least two of the L information sources such that at each $i^{th}$ transmission interval a data phasor is available for transmission. The method also includes combining an output of said modulating step using a combiner. The encoding step includes configuring the plurality of encoders to operate in at least two phases. A first phase at least involves operating $k_y$ column-encoders from among the plurality of encoders in parallel on $k_x$ bytes per column to generate the code words for a current dimension. A second phase at least involves operating $n_x$ row-encoders from among the plurality of encoders in parallel on $k_y$ memory locations per rows to generate the code words for the current dimension. The first and the second phases are repeated for remaining layers of the current dimension and for layers of other dimensions.

According to still another aspect of the present principles, there is provided a method. The method includes receiving and sampling an input signal using a sampler to obtain samples for an input sequence included in the input signal. The method further includes determining candidate symbols for the input sequence from the samples. The method also includes iteratively decoding the candidate symbols to obtain decoded code words using one or more decoders. Each of the one or more decoders is implemented based on multidimensional turbo-product codes (MTPCs). The decoding step includes configuring the plurality of decoders to operate in at least two phases. A first phase at least involves operating $k_y$ column-decoders from among the plurality of decoders in parallel on $k_x$ bytes per column to decode the codewords for a current dimension. A second phase at least involves operating $n_x$ row-decoders from among the plurality of decoders in parallel on $k_y$ memory locations per rows to generate the code words for the current dimension. The first and the second phases are repeated for remaining layers of the current dimension and for layers of other dimensions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
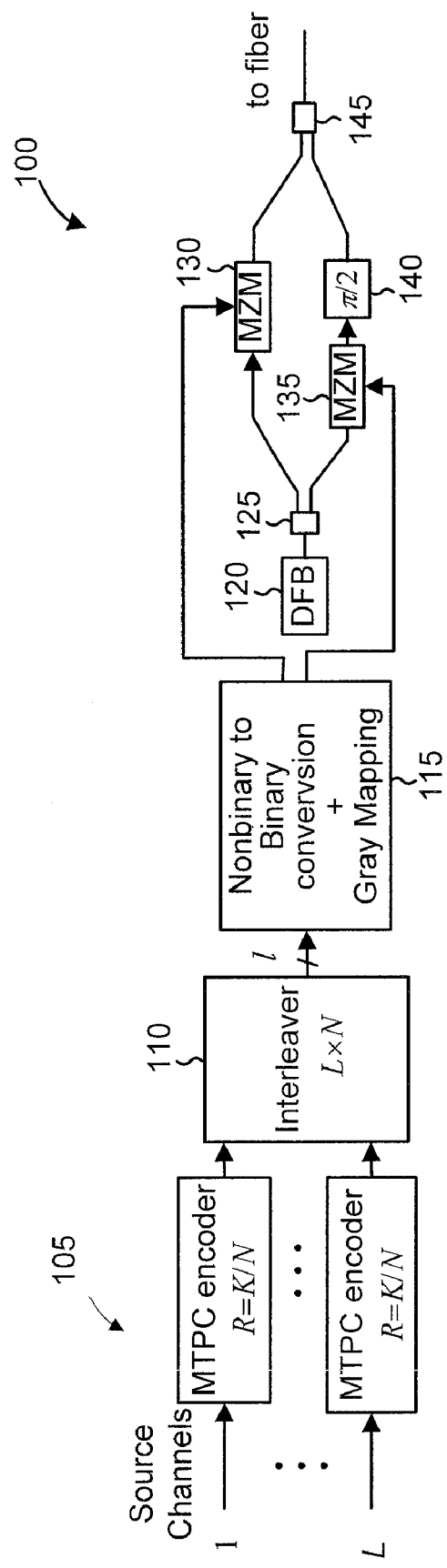
FIG. 1 is a block diagram showing a transmitter in accordance with an embodiment of the present principles.

Referring now in detail to the figures in which like numerals represent the same or similar elements and initially to FIG. 1, a transmitter 100 in accordance with an embodiment of the present principles is shown. The transmitter 100 includes a series of multidimensional turbo-product code (MTPC) encoders 105, an interleaver 110, a non-binary to binary conversion and gray mapper 115, a distributed feedback (DFB) laser 120, a 3 dB coupler (splitter) 125, a first Mach-Zehnder modulator (MZM) 130, a second MZM 135, a phase shifter ($\pi/2$) 140, and a 3 dB coupler (combiner) 145.

Figure 2:
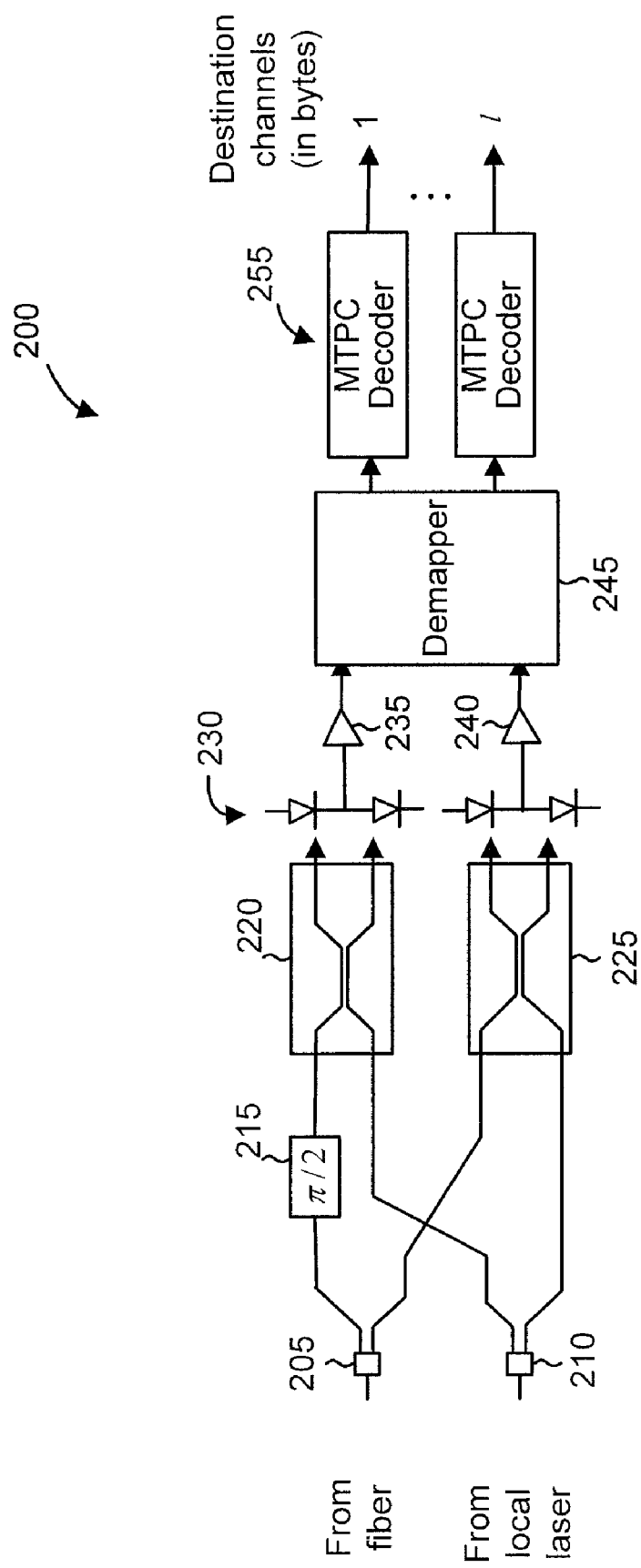
FIG. 2 is a block diagram showing a receiver in accordance with an embodiment of the present principles.

FIG. 2 shows a receiver 200 in accordance with an embodiment of the present principles. The receiver 200 includes a first 3 dB coupler 205, a second 3 dB coupler 210, a phase shifter ($\pi/2$) 215, an upper directional coupler 220, a lower directional coupler 225, a series of photo detectors 230, a trans impedance amplifier 235, a trans impedance amplifier 240, a demapper 245, and a series of LDPC decoders 255. It is to be appreciated that the demapper 245 includes a sampler, where sampling is performed by the demapper 245 subsequent to a demapping operation when the demapper 245 is implemented in the analog domain, and is performed by the demapper 245 prior to a demapping operation when the demapper is implemented in the digital domain.

Elements of the transmitter 100 and receiver 200 are described in further detail herein after with respect to various aspects of the present principles.

Figure 3:
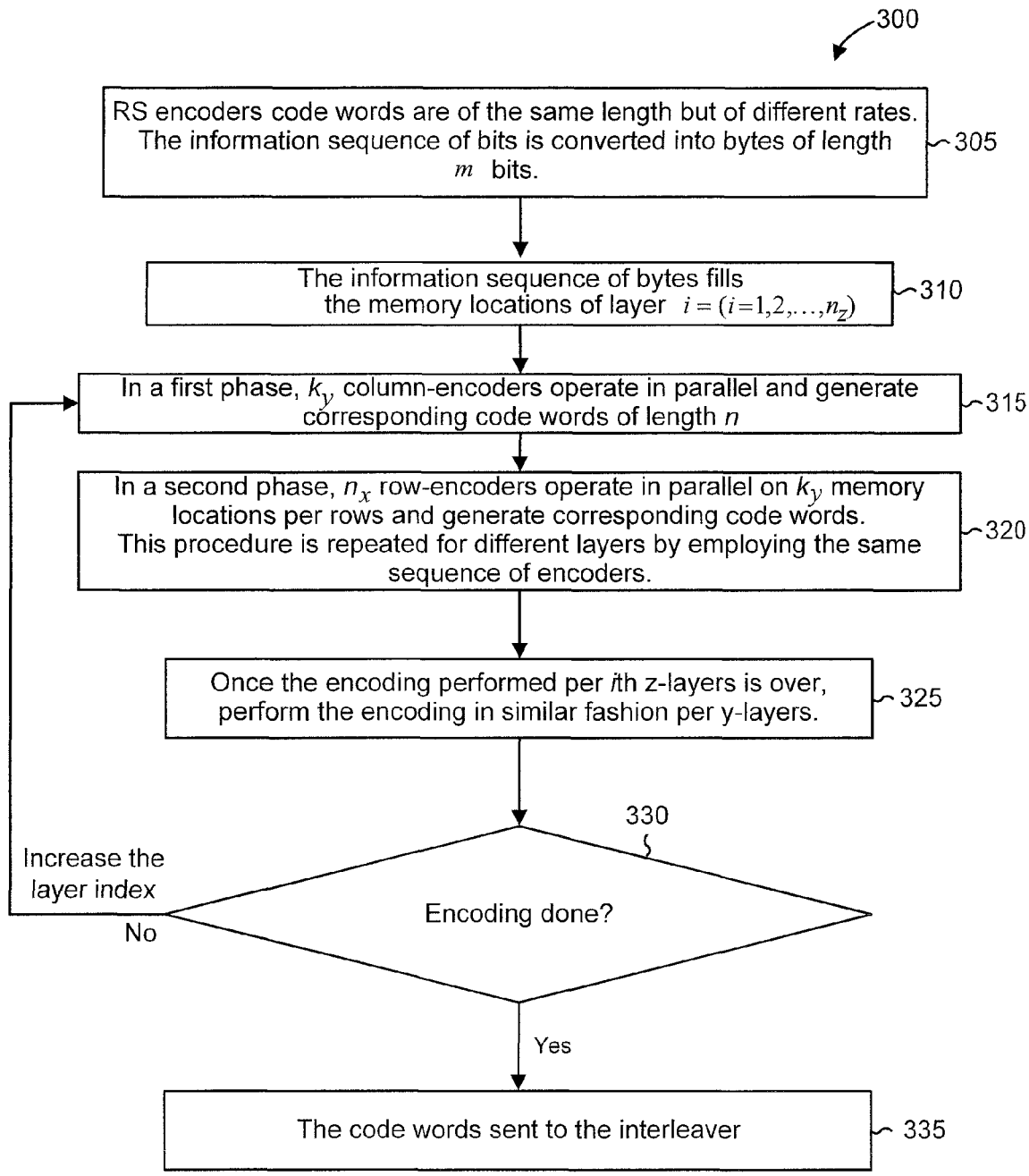
FIG. 3 is a flow diagram showing a partially parallel encoding method for multidimensional turbo-product codes, in accordance with an embodiment of the present principles.

FIG. 3 shows a partially parallel encoding method 300 for multidimensional turbo-product codes, in accordance with an embodiment of the present principles.

At step 305, an information sequence including Reed-Solomon encoded code words having the same length but different rates is received and converted into an information sequence of bytes of length $M=\log_2 n$ bits.

At step 310, memory locations of layer $i (i=1, 2, \ldots, n_z)$ are filled by the information sequence of bytes.

At step 315, in a first phase, $k_y$ column-encoders operate in parallel and generate corresponding code words of length n.

At step 320, in a second phase, $n_x$ row-encoders operate in parallel on $k_y$ memory locations per rows and generate corresponding code words.

At step 325, once the encoding performed for the $i^{th}$ z-layer is over, encoding is performed in a similar fashion per y-layers. Namely, steps 315 and 320 are repeated for different layers by employing the same sequence of encoders.

At step 330, it is determined whether or not encoding is done. If so, then control is passed to step 335. Otherwise, control is returned to step 315.

At step 335, the code words are sent to the interleaver.

Figure 4:
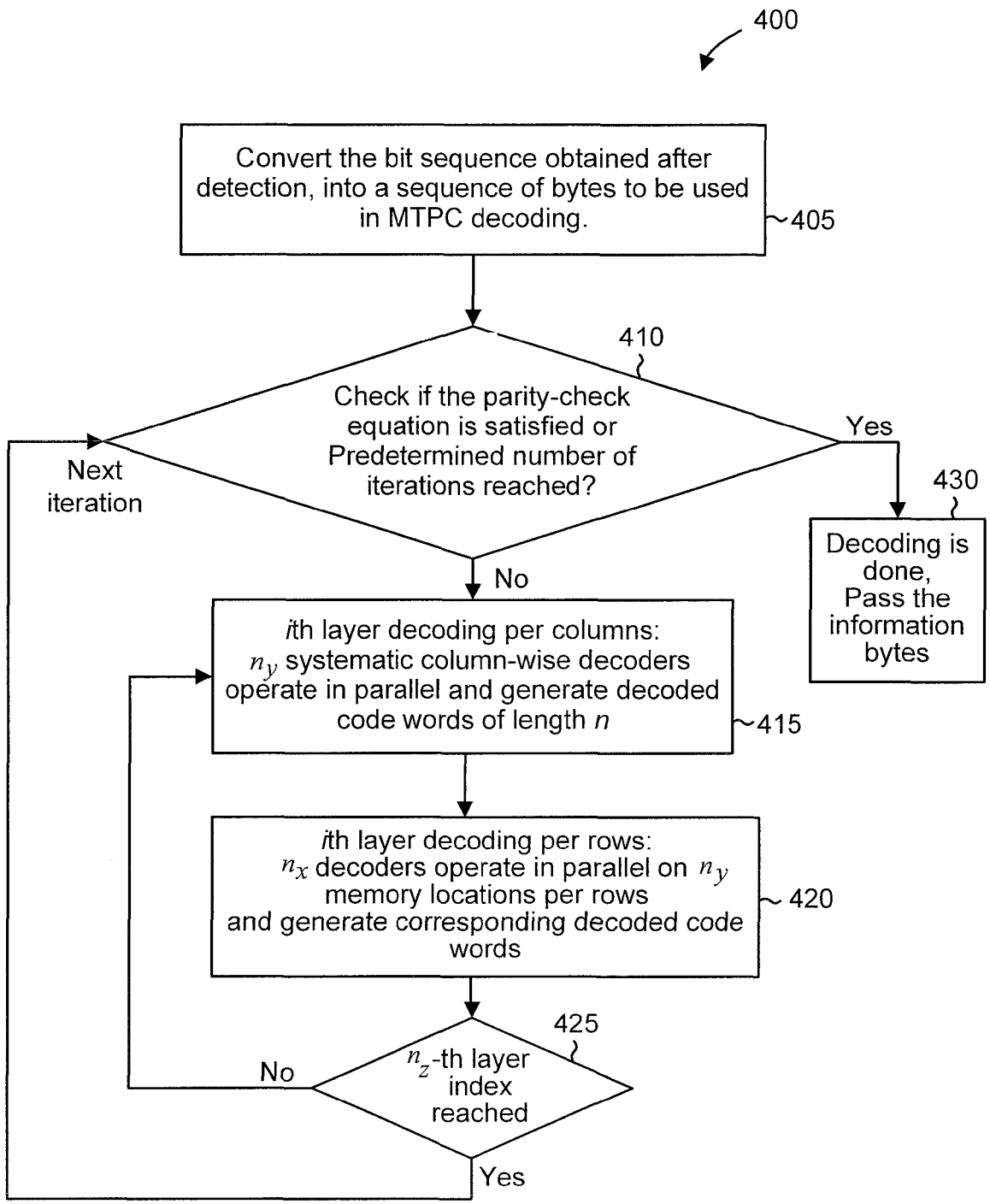
FIG. 4 is a flow diagram showing a partially parallel decoding method for multidimensional turbo-product codes, in accordance with an embodiment of the present principles.

FIG. 4 shows a partially parallel decoding method 400 for multidimensional turbo-product codes, in accordance with an embodiment of the present principles.

At step 405, a bit sequence obtained after detection is converted into a sequence of bytes to be used in MTPC decoding.

At step 410, it is determined whether or not a parity-check equation has been satisfied or whether a predetermined number of iterations has been reached.

If so, then at step 430 decoding is concluded and the information bytes are passed to an end user. Otherwise, control is passed to step 415.

At step 415, $i^{th}$ layer decoding per columns is performed, such that $n_y$ systematic column-wise decodes operate in parallel and generate decoded code words of length n.

At step 420, $i^{th}$ layer decoding per rows is performed, such that $n_x$ decoders operate in parallel on $n_y$ memory locations per rows and generate corresponding decoded code words.

At step 425, it is determined whether or not the $n_z^{th}$ layer index has been reached. If so, then control is returned to step 410. Otherwise, control is returned to step 415.

Steps of the methods 300 and 400 are described in further detail herein after with respect to various aspects of the present principles.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

We present two hard-decision decoding FEC schemes suitable for use in beyond 100 Gb/s transmission. The first scheme is based on multidimensional turbo product codes (MTPCs) with component RS codes. The three-dimensional TPC code of rate 0.8 with component RS(255, 237) code, provides the net effective coding gain is of 9.33 dB at BER of $10^{-15}$. The second scheme is based on generalized LDPC codes (GLDPC) with component RS codes. The GLDPC code of code rate 0.82 with component codes being (255, 239) and (255, 223) RS codes provides the net effective coding gain of 9.67 dB at BER of $10^{-15}$.

Given the lack of analog to digital (A/D) converters operating at data rates $\geq 100$ Gb/s, we propose two FEC schemes: (i) a FEC scheme based on multidimensional TPCs (MTPCs) with component Reed-Solomon (RS) codes; and (ii) the generalized LDPC (GLDPC) codes with component codes being either MTPCs or RS codes. These schemes operate on hard decisions only, and provide competitive coding gains compared to a soft decision scheme, based on concatenation of an LDPC code and a RS code, as previously proposed as a possible candidate for 100 Gb/s transmission. We further study the BER performance of the proposed schemes when used in combination with multilevel modulation schemes, such as M-ary QAM. The three-dimensional (3D)-TPC of rate 0.8, based on (255, 237) RS code as a component code, provides the net effective coding gain of 9.33 dB at BER of $10^{-15}$. This scheme outperforms standard RS(255, 239) code by 5.02 dB at BER around $10^{-10}$. On the other hand, the GLDPC code of rate 0.82, based on (255, 239) and (255, 223) RS codes as component codes, provides the net effective coding gain of 9.67 dB at BER of $10^{-15}$, and outperforms standard RS(255, 239) code by 5.36 dB at BER of $10^{-10}$.

A description will now be given regarding multidimensional TPCS and GLDPC codes with component RS codes.

Figure 5:
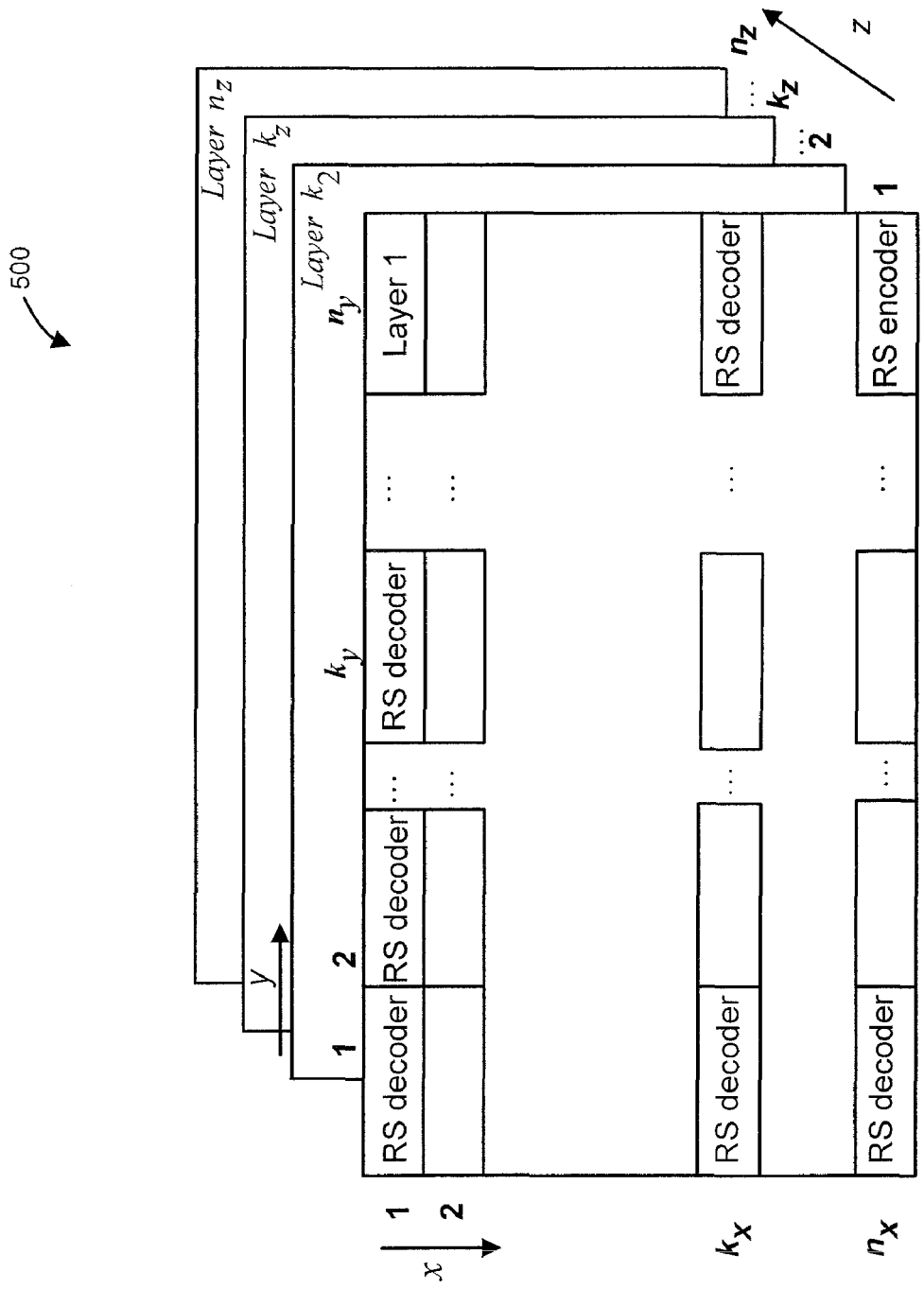
FIG. 5 is a diagram showing an example of a 3-dimensional TPC, with RS component codes, in accordance with an embodiment of the present principles.

The multidimensional turbo-product codes, proposed here, are a generalization of turbo-product codes. The D-dimensional turbo product code is an $(n_1, n_2 \ldots n_D, k_1 k_2 \ldots, k_D, d_1 d_2 \ldots, d_D)$ code in which code words form an $n_1 \times n_2 \times \ldots \times n_D$ array such that ith dimension code word is obtained from an $(n_i, k_i, d_i)$ code $C_i$. With $n_i, k_i$ and $d_i$ (i=1, 2, ..., N), we denote the code word length, dimension and minimum distance, respectively, of the $i^{th}$ component code. FIG. 5 shows an example of a 3-dimensional TPC, with RS component codes, in accordance with an embodiment of the present principles.

The different options to perform encoding/decoding can be classified as serial, parallel, and partially parallel. In the serial version, only three different encoders/decoders are needed, each performing encoding/decoding in a corresponding dimension. If the component RS codes are identical, then only one RS encoder/decoder is needed. The encoding/decoding latency of this scheme is high, but the complexity is low. In the parallel implementation, we need $n_y \times n_z$ encoders/decoders performing the encoding/decoding in the x-direction, $n_x \times n_z$ encoders/decoders performing the encoding/decoding in the y-direction, and $n_x \times n_y$ encoders/decoders performing the encoding/decoding in the z-direction. The encoding/decoding latency of this scheme is low, while the encoding/decoding complexity is high. As a compromise between the serial scheme and the parallel scheme, we propose to implement the partially parallel scheme. One possible implementation of the partially parallel scheme will be now described. The implementation requires $n_y$ encoders/decoders performing encoding/decoding in the x-direction, $n_x$ encoder/decoders performing encoding/decoding in the y-direction, and $n_y$ encoders/decoders performing encoding/decoding in the z-direction. Particularly simple is the partially parallel scheme for which $n_x=n_y=h_z=n$ employing identical RS(n, k) codes operating in parallel, whose BER performance is described herein after. Next, we describe the encoding/decoding process for the partially parallel scheme described above, with different Reed-Solomon encoders being of the same length but of different rates, namely $R_x=k_x/n$, $R_y=k_y/n$, and $R_z=k_z/n$. The information sequence of bits is converted into bytes of length m bits (e.g., for RS(255, 239) code m=8) The information sequence of bytes fills the memory locations of layer i (i=1, 2, ..., $n_z$), organized in a fashion similar to that from FIG. 5, where $k_s$ bytes per column for $k_y$ encoders operate in parallel, and $n_y$ systematic encoders operate in parallel and generate corresponding code words of length n. In the second phase, $n_x$ encoders operate in parallel on $k_y$ memory location per rows and generate corresponding code words. This procedure is repeated for different layers by employing the same sequence of encoders. Once the encoding per z-layers is done, the encoding is performed in similar fashion over other dimensions layers. Transmission can further be done layer by layer (for example, in the z-direction), by transmitting the code words in column-wise fashion, after appropriate mapping. Before further describing the transmitter and receiver architectures, let us briefly discuss the error correction capability of this scheme. If identical RS(n, k) codes of minimum distance d are used, then the minimum distance would be $d^N$, where N>2 is the dimensionality of MTPC, which would result in a much more powerful scheme than TPC whose minimum distance grows as $d^2$. For example, a 3D-TPC scheme with RS(255, 237) code has a code rate of 0.8 and a minimum distance of $9^3$=729 bytes! This scheme is also very efficient in dealing with error bursts due to intra-channel nonlinearities. If $b_x$, $b_y$, and $b_z$ are the respective burst error capabilities along the x-direction, the y-direction, and the z-direction, then the 3D-TPC would be able to correct the burst error of length $b=\max(n_y n_z b_x, n_x n_z b_y, n_x n_y b_z)$ bytes.

The code rate of an MTPC is determined by the following:

$$R = \prod_{i=1}^{N} R_i \quad (1)$$

where $R_i=k_i/n_i$ is the code rate of ith component code.

The proposed MTPC can be used as constituent code to build the more powerful GLDPC codes with component MTPCs. The parity check matrix H of Boutros-like non-binary GLDPC codes can be partitioned into W sub-matrices $H_1, \ldots, H_W$. $H_1$ is a block-diagonal matrix generated from an identity matrix by replacing the ones by the parity-check matrices $H_i^{MTPC}$ of the constituent MTPCs of code word length N and dimension $K_i$, i=1, 2, ..., $N_t/N$. With $N_t$, we denote the code word length of GLDPC code. Each sub-matrix $H_j$ is derived from $H_1$ by random permutations $\pi_{j-1}$ as given below:

$$H = [H_1^T \ \ldots \ H_W^T]^T, \quad (2)$$

$$H_1 = \begin{bmatrix} H_1^{MTPC} & 0 & 0 & \ldots & 0 & 0 \\ & H_2^{MTPC} & 0 & \ldots & 0 & 0 \\ \ldots & & & & & \ldots \\ 0 & 0 & 0 & 0 & & H_{N_t/N}^{MTPC} \end{bmatrix}$$

$$H_j = \pi_{j-1}(H_1), j = 2, \ldots, W$$

For example, let the 3D-MTPC code based on RS(255, 247) code be used as constituent code. The corresponding GLDPC code, when W=2, would be of rate 0.818. The code rate of a GLDPC code is lower bounded by the following:

$$R \geq 1 - W\left(1 - \frac{\sum_{i=1}^{N_t/N} K_i}{N_t}\right). \quad (3)$$

The parameters in Equation (3) were introduced earlier. To reduce the complexity of GLDPC codes, RS codes may be used as component codes instead of MTPCs.

Referring back to FIGS. 1 and 2, the transmitter 100 and receiver 200 for RS-based MTPC-coded M-ary QAM transmission are shown. The bit streams originating from L different information sources are converted into bytes and encoded using different (N, $K_i$) MTPCs of code rate $R_i=K_i/N$. $K_i$ denotes the number of information bytes of the ith (i=1, 2, . . . , L) component MTPC, and N denotes the code word length, which is the same for all MTPCs. The use of different MTPCs allows us optimally to allocate the code rates. The outputs of L MTPC encoders 105 are written row-wise into the block-interleaver 110. The mapper 115 accepts $l=\log_2 L$ bytes at time instance j from the (1×n) interleaver 110 column-wise, performs non-binary to binary conversion and, based on l bits, determines the corresponding M-ary ($M=2^l$) signal constellation point $s_i=(\phi_{I,i}, \phi_{Q,i})=|s_i|\exp(j\phi_i)$. The coordinates in $s_j$ correspond to in-phase and quadrature components of an M-ary two-dimensional constellation. The data phasor $\phi_i \in \{0, 2\pi/M, \ldots, 2\pi(M-1)/M\}$ is sent at each $i^{th}$ transmission interval. The outputs at I- and Q-branches at the receiver 200 side, are sampled at the symbol rate, while the symbol log-likelihood ratios (LLRs) are calculated in the a posteriori probability (APP) demapper 245 as follows $$\lambda(s) = \log \frac{P(s=s_0 | r)}{P(s \neq s_0 | r)}, \quad (4)$$

where P(s|r) is determined by using Bayes' rule as follows $$P(s|r) = \frac{P(r|s)P(s)}{\sum_{s'} P(r|s')P(s')}. \quad (5)$$

The symbol $s=(I_i, Q_i)$ represents the transmitted signal constellation point at time instance i, while $r=(r_1, r_Q)$, $r_1=v_1(t=iT_s)$, and $r_Q=v_Q(t=iT_s)$ are the samples of I- and Q-detection branches from FIG. 2. The decision symbol is obtained by maximizing the symbol LLRs in Equation (4). Such obtained symbol sequence is converted into a binary sequence. Equation (4) is performed in the analog domain. Another option is to use a series of threshold circuits to determine the candidate symbols.

Before decoding starts, we have to convert the bit sequence obtained after detection, into a sequence of N symbols to be used in MTPC decoding. In an embodiment, the decoding procedure involves the following: in a first phase, $n_y$ systematic decoders operate in parallel and generate decoded code words of length n. In a second phase, $n_x$ decoders operate in parallel on $n_y$ memory locations per rows and generate corresponding decoded code words. This procedure is repeated for different layers by employing the same sequence of decoders. Once the decoding performed per z-layers is over, we perform the decoding in a similar fashion over z-layers.

A description will now be given regarding evaluation of the proposed MTPC scheme with component RS codes.

Thus, we propose two hard-decision decoding FEC schemes. The first scheme is based on multilevel TPCs with component RS codes. The second scheme is based on GLDPC codes with component codes being either MTPCs or RS codes. We explain how these schemes can be used in combination with multilevel modulation formats, such as M-ary QAM. We show that GLDPC-coded 16-QAM outperforms the corresponding 16-PSK scheme by about 3.6 dB. By using the RS-based MTPC in combination with 16-QAM and coherent detection, the aggregate rate of 400 Gb/s per wavelength channel may be achieved by using transmission equipment operating at 100 Giga symbols/s. Through the use of polarization division multiplexing and selecting the symbol rate 125 Giga symbols/s, the aggregate rate can be further increased to 1 Tb/s per wavelength channel, the option that might be of interest for future 1 Tb/s Ethernet.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A transmitter, comprising:
a plurality of encoders configured to encode source bit streams from L information sources into bytes of code words, each of the plurality of encoders including different (n, k) multidimensional turbo-product codes (MTPCs) of code rate R=k/n, where k is a number of information bytes, and n is codeword length;
wherein said plurality of encoders are configured to operate in at least two phases, a first phase at least involving operating $k_y$ column-encoders from among the plurality of encoders in parallel on $k_x$ bytes per column to generate the code words for a current dimension, and a second phase at least involving operating $n_x$ row-encoders from among the plurality of encoders in parallel on $k_y$ memory locations per rows to generate the code words for the current dimension, the first and the second phases being repeated for remaining layers of the current dimension and for layers of other dimensions.

2. The transmitter of claim 1, further comprising:
an interleaver configured to collect L row-wise code words from the plurality of encoders, where L is also a number of the source bit streams;
a mapper configured to determine an M-ary signal constellation point based on L bits received from said interleaver, where L is also a number of encoders being used, and M is the signal constellation size; and
an upper Mach-Zehnder modulator (MZM) and a lower MZM respectively are configured to modulate an in-phase channel and a quadrature channel.

3. The transmitter of claim 2, wherein said mapper is configured to receive $l=\log_2 M$ bytes at a time column-wise from the interleaver, perform non-binary to binary conversion of the received bytes, and determine the M-ary signal constellation point based on the received and converted bytes.

4. The transmitter of claim 2, wherein said mapper includes a Gray mapper.

5. The transmitter of claim 1, wherein an aggregate transmission rate is at least 100 Gb/s.

6. The transmitter of claim 1, wherein said plurality of encoders includes L encoders configured in parallel.

7. The transmitter of claim 1, wherein different codes rates are used by said plurality of encoders, the different code rates being $R_x=k_x/n$, $R_y=k_y/n$, and $R_z=k_z/n$, for x, y, and z directions, respectively.

8. The transmitter of claim 1, wherein the source bit streams from the L information sources are encoded into bytes of length m bits, where m is the number of bits per byte used in a respective one of the plurality of encoders.

9. The transmitter of claim 1, wherein the MTPCs are configured such that the code words encoded thereby form an $n_1 \times n_2 \times \ldots \times n_D$ array such that an $i^{th}$ dimension code word is obtained from an $(n_i, k_i, d_i)$ code $C_i$, wherein $n_i$, $k_i$, and $d_i$ are the length, dimension, and minimum distance, respectively, of an $i^{th}$ component code.

10. A receiver, comprising:
a demapper configured to receive samples of an input signal and determine candidate symbols for an input sequence included in the input signal; and
one or more decoders configured to iteratively decode the input sequence based on the candidate symbols to obtain decoded codewords, each of the one or more decoders being implemented based on multidimensional turbo-product codes (MTPCs),
wherein said plurality of decoders are configured to operate in at least two phases, a first phase at least involving operating $k_y$ column-decoders from among the plurality of decoders in parallel on $k_x$ bytes per column to generate the codewords for a current dimension, and a second phase at least involving operating $n_x$ row-decoders from among the plurality of decoders in parallel on $k_y$ memory locations per rows to generate the code words for the current dimension, the first and the second phases being repeated for remaining layers of the current dimension and for layers of other dimensions.

11. The receiver of claim 10, further comprising an output configured to pass information bytes when a parity check equation or a predetermined number of iterations is satisfied.

12. The receiver of claim 10, wherein an aggregate reception rate is at least 100 Gb/s.

13. The receiver of claim 10, wherein said plurality of decoders includes L decoders configured in parallel.

14. The receiver of claim 10, wherein said demapper is an a posteriori probability (APP) demapper implemented in the analog domain.

15. The receiver of claim 10, wherein the candidate symbols are determined from the samples using one of two approaches, a first approach involving a plurality of threshold circuits to determine the candidate symbols, a second approach involving determining symbol reliabilities in the analog domain and selecting the candidate symbols based on a respective maximum magnitude symbol reliability.

16. A method, comprising:
encoding source bit streams from L information sources into bytes of code words using a plurality of encoders, each of the plurality of encoders including different (n, k) multidimensional turbo-product codes (MTPCs) of code rate R=k/n, where k is a number of information bytes, and n is code word length;
modulating at least two of the L information sources such that at each $i^{th}$ transmission interval a data phasor is available for transmission; and
combining an output of said modulating step using a combiner,
wherein said encoding step comprises configuring the plurality of encoders to operate in at least two phases, a first phase at least involving operating $k_y$ column-encoders from among the plurality of encoders in parallel on $k_x$ bytes per column to generate the code words for a current dimension, and a second phase at least involving operating $n_x$ row-encoders from among the plurality of encoders in parallel on $k_y$ memory locations per rows to generate the code words for the current dimension, the first and the second phases being repeated for remaining layers of the current dimension and for layers of other dimensions.

17. The method of claim 16, further comprising:
collecting L row-wise code words from the plurality of encoders, where L is also a number of encoders; and
receiving L bits at a time from amongst the L row-wise code words collected by said collecting step and determining an M-ary signal constellation point, where L is also a number of encoders and $M=2^L$,
wherein said modulating step comprises modulating an in-phase channel and a quadrature channel using an upper Mach-Zehnder modulator (MZM) and a lower MZM, respectively.

18. The method of claim 16, wherein an aggregate transmission rate is at least 100 Gb/s.

19. The method of claim 16, wherein said plurality of encoders includes L encoders configured in parallel.

20. The method of claim 16, wherein different codes rates are used by said plurality of encoders, the different code rates being $R_x=k_x/n$, $R_y=k_y/n$, and $R_z=k_z/n$, for x, y, and z directions, respectively.

21. The method of claim 16, wherein the source bit streams from the L information sources are encoded into bytes of length m, where m is a number of bits per byte.

22. The method of claim 16, wherein the MTPCs are configured such that the code words encoded thereby form an $n_1 \times n_2 \times \ldots \times n_D$ array such that an $i^{th}$ dimension code word is obtained from an $(n_i, k_i, d_i)$ code $C_i$, wherein $n_i$, $k_i$, and $d_i$ are the length, dimension, and minimum distance, respectively, of an $i^{th}$ component code.

23. A method, comprising:
receiving and sampling an input signal using a sampler to obtain samples for an input sequence included in the input signal;
determining candidate symbols for the input sequence from the samples; and
iteratively decoding the candidate symbols to obtain decoded code words using one or more decoders, each of the one or more decoders being implemented based on multidimensional turbo-product codes (MTPCs),
wherein said decoding step comprises configuring the plurality of decoders to operate in at least two phases, a first phase at least involving operating $k_y$ column-decoders from among the plurality of decoders in parallel on $k_x$ bytes per column to decode the codewords for a current dimension, and a second phase at least involving operating $n_x$ row-decoders from among the plurality of decoders in parallel on $k_y$ memory locations per rows to generate the code words for the current dimension, the first and the second phases being repeated for remaining layers of the current dimension and for layers of other dimensions.

24. The method of claim 23, wherein an aggregate reception rate is at least 100 Gb/s.

25. The method of claim 23, wherein said plurality of decoders includes L decoders configured in parallel.

26. The method of claim 23, wherein the candidate symbols are determined from the samples using one of two approaches, a first approach involving a plurality of threshold circuits to determine the candidate symbols, a second approach involving determining symbol reliabilities in the analog domain and selecting the candidate symbols based on a respective maximum magnitude symbol reliability.

* * * * *